(12) United States Patent
Osipov et al.

(10) Patent No.: US 7,208,775 B2
(45) Date of Patent: Apr. 24, 2007

(54) POLARIZED RADIATION SOURCE USING SPIN EXTRACTION/INJECTION

(75) Inventors: Viatcheslav V. Osipov, Mountain View, CA (US); Alexandre M. Bratkovski, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 162 days.

(21) Appl. No.: 11/061,060

(22) Filed: Feb. 18, 2005

(65) Prior Publication Data

US 2006/0186432 A1  Aug. 24, 2006

(51) Int. Cl.
*H01L 33/00* (2006.01)
(52) U.S. Cl. ............... 257/103; 257/295; 257/E33.068
(58) Field of Classification Search ............... 257/103
See application file for complete search history.

(56) References Cited

U.S. PATENT DOCUMENTS

| | | | |
|---|---|---|---|
| 5,874,749 A * | 2/1999 | Jonker | 257/98 |
| 6,043,515 A | 3/2000 | Kamaguchi et al. | |
| 2004/0179567 A1 | 9/2004 | Osipov et al. | |

OTHER PUBLICATIONS

Bland, J.A.C. et al., "Spin selective transport at the ferromagnet/semiconductor interface" Current Applied Physics 3 (2003) 429-432.
Gregg, J.F. et al., "Spin Electronics—a review" Journal of Physics D: Applied Physics 35 (2002) R121-R155.
Jonker, B.T. et al., "Electrical Spin Injection and Transport in Semiconductor Spintronic Devices" MRS Bulletin (Oct. 2003) 740-748.
Pearton, S.J. et al., "Recent Advances in Gate Dielectrics and Polarised Light Emission From GaN" OptoElectronics Review 10(4) (2002) 231-236.
Yu, Z.G. et al., "Circularly Polarized Electroluminescence in spin-LED Structures" arXiv:cond-mat/0308220 v1 (Aug. 12, 2003) 1-5.

* cited by examiner

*Primary Examiner*—Tu-Tu Ho

(57) ABSTRACT

Spin-polarized electrons can be efficiently extracted from an n-doped semiconductor layer (n-S) by forming a modified Schottky contact with a ferromagnetic material (FM) and a δ-doped layer at an interface under forward bias voltage conditions. Due to spin-selection property of the FM-S junction, spin-polarized carriers appear in the n-doped semiconductor layer near the FM-S interface. If a FM-n-n'-p heterostructure is formed, where the n' region is a narrower gap semiconductor, polarized electrons from the n-S region and holes from the p-S region can diffuse into the n'-S region under the influence of independent voltages applied between the FM and n' regions and the n' and p regions. The polarized electrons and holes recombine in the n'-S region and produce polarized light. The polarization can be controlled and modulated by controlling the applied voltages.

23 Claims, 5 Drawing Sheets

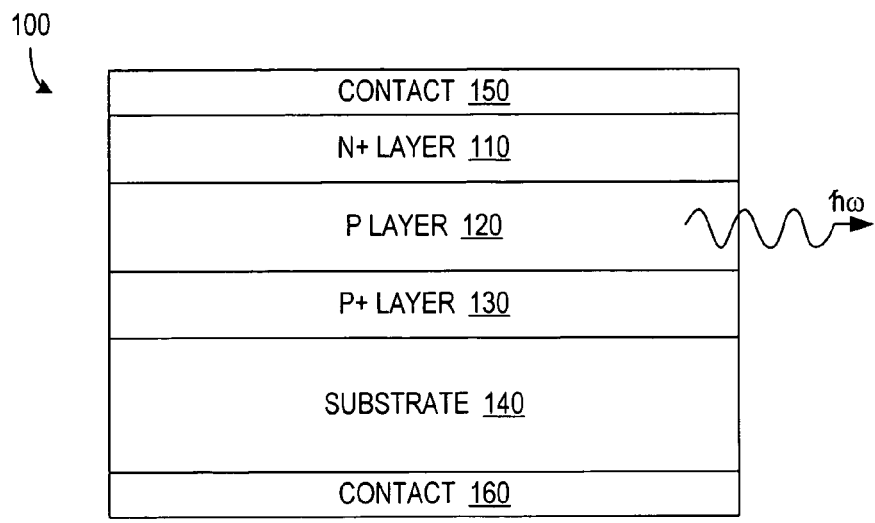
FIG. 1A *(PRIOR ART)*
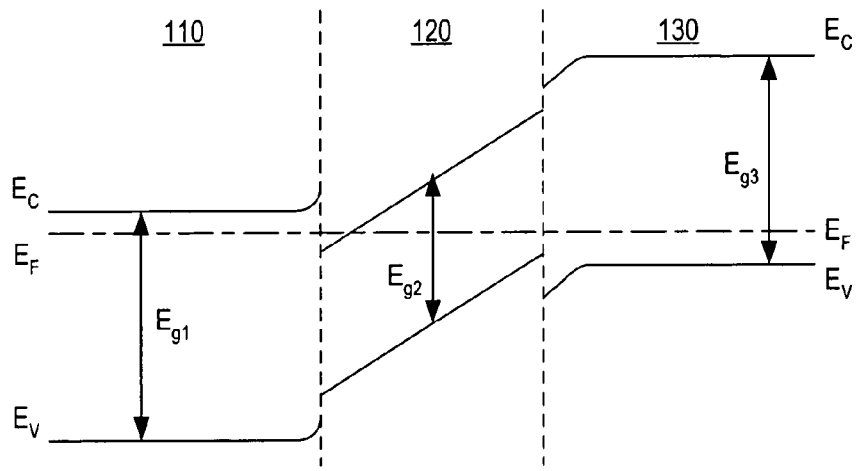
FIG. 1B *(PRIOR ART)*
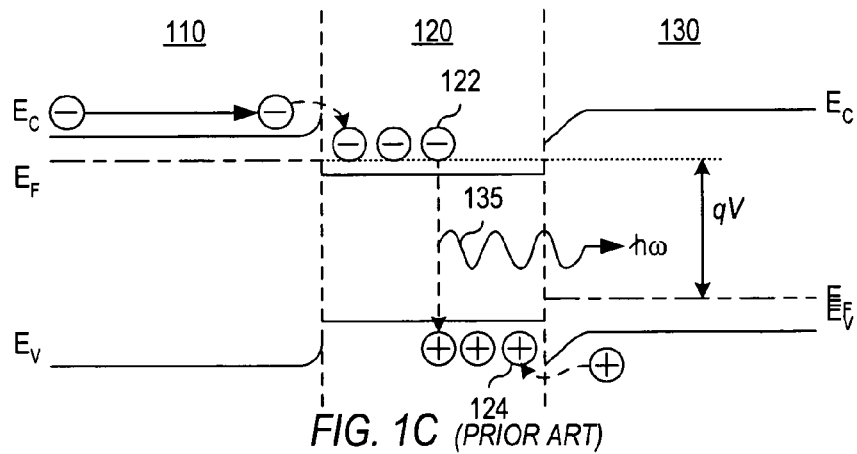
FIG. 1C *(PRIOR ART)*

POLARIZED RADIATION SOURCE USING SPIN EXTRACTION/INJECTION

RELATED APPLICATIONS

The following applications, which are hereby incorporated by reference in their entirety, may contain some common disclosure and may relate to the present invention: U.S. patent application Ser. No. 10/284,360, entitled "Efficient Spin Injection into Semiconductors" (now U.S. Pat. No. 6,809,388, issued Oct. 26, 2004); U.S. patent application Ser. No. 10/284,183, entitled "Magnetic Sensor Based on Efficient Spin Injection into Semiconductors" (now U.S. Pat. No. 6,774,446, issued Aug. 10, 2004); and U.S. patent application Ser. No. 10/387,480, entitled "Hetero Laser and Light-Emitting Source of Polarized Radiation" (published as Publication No. 2004-0179567 on Sep. 16, 2004).

BACKGROUND

The interactions or behaviors of the spin states of electrons in the presence of magnetized materials have provided the basis for development of many solid-state magnetoelectronic and spintronic devices. For example, some multi-layer storage devices containing magnetized ferromagnetic materials use giant magnetoresistance (GMR), where a relatively small change in magnetism causes a large change in resistance. Some other spintronic devices similarly use large tunnel magnetoresistance ("TMR"), which can be observed in structures including an insulating tunnel barrier sandwiched between two magnetized ferromagnetic layers of similar or different materials.

A class of solid-state devices that is currently better known than spintronic or magnetoelectronic devices is semiconductor light sources. Semiconductor light sources include such devices as light-emitting diodes (LEDs) and semiconductor lasers, e.g., vertical cavity surface emitting lasers (VCSELs) and edge-emitting lasers. The technology required for fabrication and operation of these semiconductor light source is relatively mature and generally well known in the art. However, development of solid-state sources of polarized radiation, i.e., lasers and LEDs that produce polarized light, is an urgent problem for optical communication because conventional solid-state light sources generally produce light with a low degree of polarization.

FIG. 1A illustrates a schematic model of a conventional light-emitting diode (LED) 100. LED 100 includes three adjacent semiconductor layers 110, 120, and 130, an underlying substrate 140, and electrical contacts 150 and 160 respectively above semiconductor layer 110 and below the substrate 140. In a typical configuration, the top and bottom semiconductor layers 110 and 130 are both relatively heavily doped with impurities of the opposite conductivity types. For example, in the configuration illustrated in FIG. 1A, semiconductor layer 110 is an n+ layer, and semiconductor layer 130 is a p+ layer.

The middle semiconductor layer 120, which is sometimes referred to as an activation or quantum well layer, may be either positively or negatively doped, but semiconductor layer 120 generally has a band gap that is narrower than the band gaps in the adjacent semiconductor layers 110 and 130. As a result, semiconductor layer 120 is associated with a quantum well, which can attract or hold low energy conduction electrons and holes for recombination.

FIG. 1B illustrates a typical energy band diagram of electron states in LED 100 at equilibrium. FIG. 1B more specifically shows the Fermi level $E_F$, the bottom conduction band energy level $E_C$, and the top valence band energy level $E_V$ in each semiconductor layer 110, 120, and 130. FIG. 1B also shows the energy band gaps $E_{g1}$, $E_{g2}$ and $E_{g3}$ for respective semiconductor layers 110, 120, 130, where $E_{gi}=E_{Ci}-E_{Vi}$ when index i is 1, 2, and 3 respectively for layers 110, 120, and 130. As mentioned above, the energy band gap $E_{g2}$ in layer 120 is less than energy band gaps $E_{g1}$ and $E_{g3}$ of respective semiconductor layers 110 and 130, i.e., the energy band gaps satisfy the relation $E_{g2}<E_{g1},E_{g3}$.

FIG. 1C illustrates the injection of minority charge carriers (in this case electrons) into semiconductor layer 120 when a forward bias is applied between contacts 150 and 160. Recombination of electrons 122 and holes 124 in semiconductor layer 120 of LED 100 generates radiation (i.e., photons 135). In the configuration of FIG. 1A, LED 100 is an edge-emitting device, and photons escape from a cut edge of LED 100. The angular frequency ω and polarization of each photon emitted when an electron 122 recombines with a hole 124 depends on the energy difference of the quantum states of electron 122 and hole 124 and the spin/angular momentum states of electron 122 and hole 124. Generally, electrons 122 and holes 124 are only slightly spin-polarized (due to a weak spin-orbital coupling) in LED 100. Consequently, the radiation has a very low degree of polarization.

Efficient solid-state devices and methods for producing polarized radiation are thus sought.

SUMMARY

In accordance with an aspect of the invention, a light-emitting device includes a diode and a spin filter. The spin filter has an interface with an n-type semiconductor region of the diode or a p-type semiconductor region of the diode. Operation of the spin filter extracts spin-polarized electrons from the diode, leaving at least partially spin-polarized charge carries in the diode.

Another embodiment of the invention is light-emitting device including an n-type semiconductor region, a p-type semiconductor region, and an intervening semiconductor region between the n-type and p-type regions. A magnetized layer forms an interface with the n-type semiconductor region; and electrical contact structures permit application of independent electrical signals respectively to the n-type semiconductor region, the magnetized layer, and the p-type semiconductor region.

Yet another embodiment of the invention is a method for producing polarized radiation. The method includes: maintaining a first semiconductor region of a diode at a reference voltage; applying a bias voltage to a second semiconductor region of the diode to drive a current through the diode and cause emission of radiation; and applying a control voltage to a magnetized region that forms an interface with one of the first and second semiconductor regions. The control voltage drives a current of spin-polarized electrons through the interface.

BRIEF DESCRIPTION OF THE DRAWINGS

FIG. 1A illustrates a conventional light-emitting diode.

FIGS. 1B and 1C are energy band diagrams of electron states in the semiconductor layers of the light-emitting diode of FIG. 1A respectively without and with an applied voltage.

DETAILED DESCRIPTION

In accordance with an aspect of the invention, spin-polarized charge carriers can be extracted from a semiconductor layer of a solid-state light-emitting device such as a light-emitting diode or a semiconductor laser. As a result, the spins of the remaining conduction electrons in the device are predominantly along a preferred axis. A quantum well in the device can trap the spin-polarized conduction electrons and heavy holes for recombination, resulting in emission of photons having a definite spin direction, i.e., resulting in emission of polarized light. Spin-polarized extraction can be through an interface between a semiconductor material and a magnetized material that acts as a spin filter.

In accordance to a further aspect of the invention, a control voltage applied to control the extraction or injection of spin-polarized electrons through a spin filter can be independent of a drive voltage of a diode in a semiconductor light-emitting device. As a result, radiation from the light-emitting device can remain at an intensity corresponding to the drive voltage, while the control voltage varies as required to modulate the percentage polarization of the emitted radiation.

Figure 2A:
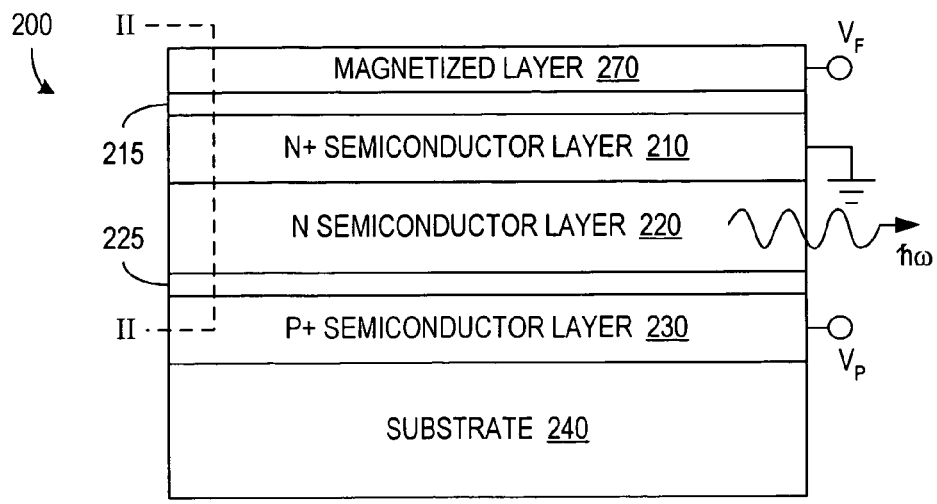
FIG. 2A illustrates a light-emitting device in accordance with an embodiment employing extraction or injection of spin-polarized electrons to control the polarization of emitted light.

FIG. 2A illustrates a light-emitting device 200 according to an embodiment of the present invention including three semiconductor layers 210, 220, and 230 on a supporting substrate 240. In the illustrated embodiment, semiconductor layer 210 is a heavily doped n-type semiconductor layer. Semiconductor layer 220, which is adjacent to n+ semiconductor layer 210, creates a quantum well, and semiconductor layer 230 is a heavily doped p-type semiconductor layer that is adjacent to semiconductor layer 220. A magnetized layer 270 is adjacent to and forms an interface with n+ semiconductor layer 210. Preferably, an intervening δ-doped layer 215 between magnetized layer 270 and n+ semiconductor layer 210 modifies the interface between magnetized layer 270 and semiconductor layer 210 as described further below. Additionally, one or more optional semiconductor layers 225 around quantum well layer 220 may be provided, for example, to separate a quantum well created in semiconductor layer 220 from the effects of charge separation arising at the p-n junction in device 200. Alternatively, as illustrated in device 200' of FIG. 2D, semiconductor layer 225 can be eliminated, so that semiconductor layer 220 forms the quantum well inside the p-n junction that n+ semiconductor layer 210 and p+ semiconductor layer 230 create.

Electrical contacts (not shown) permit application of three external voltages $V_F$, $V_P$, and ground respectively to magnetized layer 270, p+ semiconductor layer 230, and n+ semiconductor layer 210. As described further below, voltage $V_F$ controls a current of spin-polarized electrons between semiconductor layer 210 and magnetized layer 270 thus providing semiconductor layer 210 with an excess of electrons having spin in a preferred direction. Voltage $V_P$ is a bias voltage that controls the magnitude of the current through semiconductor layer 220 and thereby controls the intensity of light emitted from device 200.

Control voltage $V_F$ when positive (relative to the voltage of semiconductor layer 210) causes extraction of the spin-polarized electrons from semiconductor layer 210 through the interface with magnetized layer 270, leaving electrons in semiconductor layer 210 predominantly with spins directed along a preferred axis, e.g., predominantly "spin up." Correspondingly, electrons entering semiconductor layer 220 (i.e., entering the quantum well) from semiconductor layer 210 are spin-polarized with spins along the preferred axis. For production of polarized light, the states of holes trapped by semiconductor layer 220 are controlled through selection of properties of semiconductor layers 210, 220, and 230. In particular, semiconductor layers 210, 220, and 230 are preferably such that a quantum well associated with semiconductor layer 220 traps only heavy holes having total moment $\pm 3/2$ for recombination with the spin-polarized electrons having spin projection $+1/2$. Conservation of angular momentum then only permits recombination of electrons having spin projection $+1/2$ with heavy holes having spin/angular momentum projection $-3/2$ to produce a single photon circularly polarized photon having spin projection $-1$. The emitted photons all having the same definite spin projection results in emission of the polarized light having a circular polarization corresponding to the spin projection.

Figure 2B:
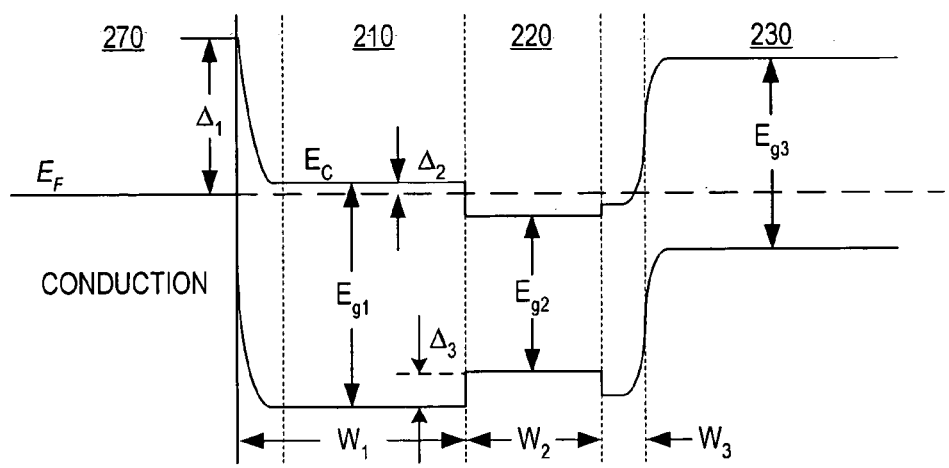
FIGS. 2B and 2C illustrate energy bands for electron states respectively without and with a bias voltage applied to the light source of FIG. 2A.

In an exemplary embodiment of device 200, semiconductor layer 210 is relatively heavily doped with n-type dopants ($n^+$), and semiconductor layer 230 is relatively heavily doped with p-type dopants ($p^+$). Semiconductor layer 220 can be either n-type or p-type semiconductor material but preferably has a band gap that is narrower than the band gap of either layer 210 or 230. The narrower band gap can be achieved by making semiconductor layer 220 from a different material from that used in semiconductor layer 210 or 230. Semiconductor layer 220 thus forms a quantum well that can trap low energy electrons and holes for recombination as described further below. To provide a definite example for illustrative purposes, FIGS. 2A and 2B show embodiments of the invention where layer 220 is n-type semiconductor.

Semiconductor layer 220 is preferably formed from a semiconductor material having direct optical transitions. For example, materials such as GaAs, AlGaAs, InGaAs, InGaPAs, InAs, GaSb, InSb, InGaSb, AlAs, AlSb, ZnTe, CdTe, HgCdTe, and similar alloys, which may include various combinations of these materials, can be used. In such semiconductors, an electron can directly recombine with a hole without emitting/absorbing phonons.

Semiconductor layers 210, 220, and 225 may also be formed from semiconductor material having direct optical transitions such as GaAs, AlGaAs, InGaAs, InGaPAs, InAs, GaSb, InSb, InGaSb, AlAs, AlSb, ZnTe, CdTe, HgCdTe, and similar alloys, which may include various combinations of these materials. However, semiconductor layers 210, 220, and 225 more generally can be made of any semiconductor material that is compatible with the material of semiconductor layer 220 if the material provides semiconductor layers 210, 220, and 225 with band gaps that are wider than the band gap in semiconductor layer 220. In general, semiconductor layers 210, 220, and 225 do not need to have direct optical transitions.

Magnetized layer 270 is preferably formed from a ferromagnetic material such as nickel (Ni), iron (Fe), and cobalt (Co) or magnetic alloys, which may include one or more combinations of Fe, Co, and Ni, but alternatively may be formed from any material having an excess or electron conduction states with one particular spin projection. Magnetic layer 270, when made of a ferromagnetic material, is preferably about 4–6 nm thick or thicker but is also preferably thinner than the typical width of a magnetic domain wall in magnetized material 270. The direction and magnitude of the magnetization of magnetized layer 270 is not critical, except that the magnetized layer should be in a monodomain state.

Figure 2C:
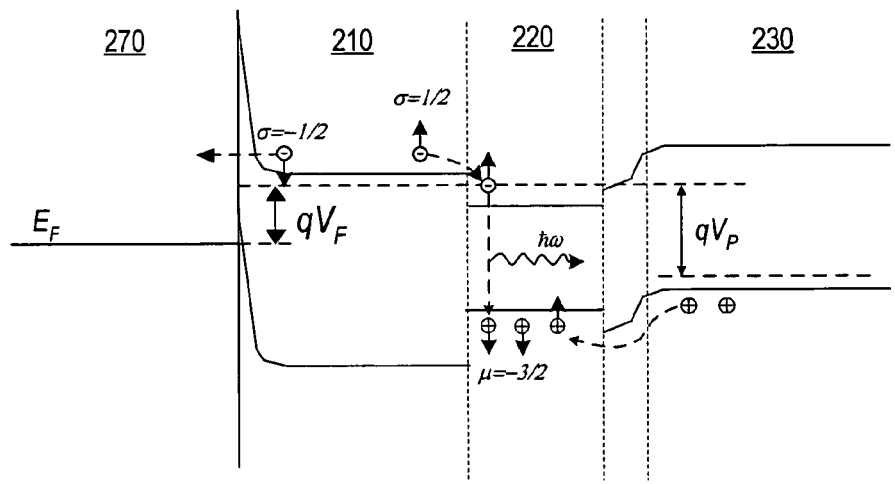
Figure 2D:
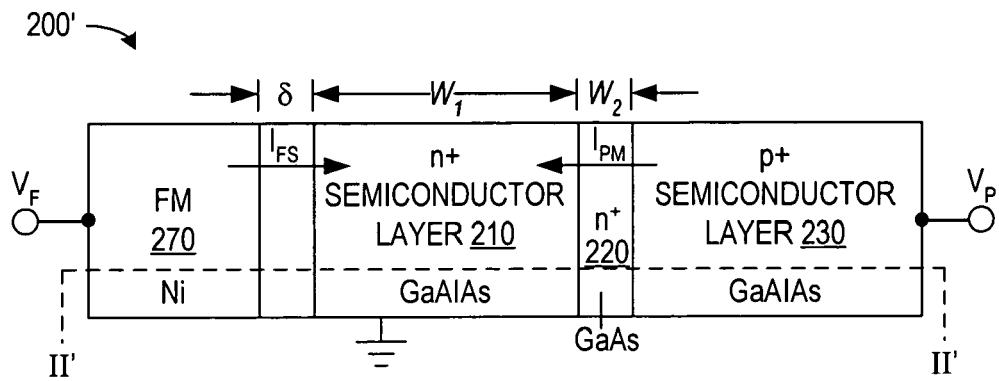
FIGS. 2D, 2E, and 2F illustrate a structure and energy band diagrams for a light-emitting device in accordance with an embodiment of the present invention having a magnetized layer adjacent to an n-type semiconductor and a quantum well inside the p-n junction.
Figure 2E:
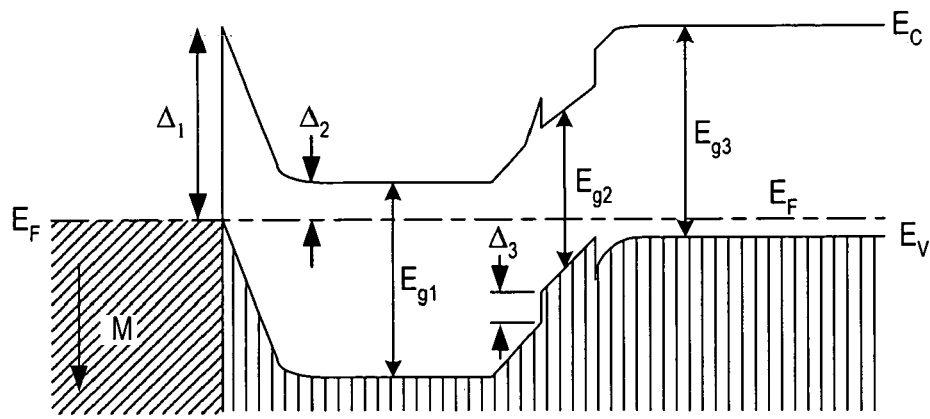

FIGS. 2B and 2E respectively show energy level diagrams for the states of electrons in devices 200 and 200'. As shown, semiconductor layer 220 has an energy band gap $E_{g2}$ that is less than the respective energy band gaps $E_{g1}$ and $E_{g3}$ of semiconductor layers 210 and 230. In FIG. 2B, a plot $E_C$ qualitatively illustrates how the minimum energy of conduction band electrons varies along the line II—II in device 200 of FIG. 2A at equilibrium, and a plot $E_V$ similarly illustrates the variation of the maximum energy of valence electrons in device 200 at equilibrium. In FIG. 2E, plots $E_C$ and $E_V$ illustrate variations at equilibrium of the minimum energy of conduction band electrons and the maximum valence energy along the line II'—II' in device 200' of FIG. 2D. The plots in FIGS. 2B and 2E differ primarily because of the absence of separating semiconductor layer 225 from device 200'. As a result, the quantum well associated with semiconductor layer 220 in FIG. 2E is within an electric field created by charge separation at the p-n junction, but the quantum well associated with semiconductor layer 220 in FIG. 2B is separated from the effects of the p-n junction.

Figure 2F:
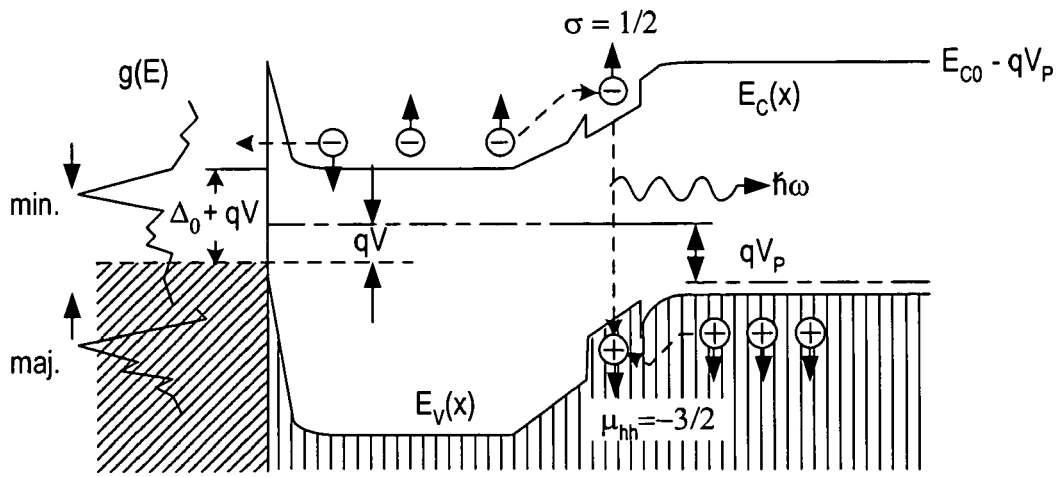

FIGS. 2C and 2F show similar plots of the bottom of the conduction band $E_C$ and the top of the valence band $E_V$ when n+ semiconductor layer 210 is at a reference voltage (ground), a positive drive voltage $V_P$ is applied to p+ semiconductor layer 230, and a control voltage $V_F$ applied to magnetized layer 270 is positive. Positive voltages $V_P$ and $V_F$ in layers 230 and 270 respectively lower the energies of electron states, e.g., by $qV_P$ and $qV_F$ where q is the magnitude of the charge of an electron. As a result, electrons from n+ semiconductor layer 210 flow both into magnetized layer 270 and through semiconductor layer 220 into p+ semiconductor layer 230. The magnetization of magnetized layer 270 causes the interface with semiconductor layer 210 to have a high resistance for one spin polarization of electrons in semiconductor layer 210, and as a result, the electrons that flow into semiconductor layer predominantly have the spin direction for which the interface has low resistance.

Semiconductor layer 210 is preferably thin enough that spin-polarized electrons largely retain their spin direction while passing through semiconductor layer 210. In other words, the thickness $W_1$ of semiconductor layer 210 is preferably much smaller than the spin diffusion length $L_{eS}$ of electrons in semiconductor layer 210. Equation 1 indicates this limitation on thickness $W_1$ where $\tau_{eS}$ is the relaxation time of electron spin and $D_e$ is the electron diffusion coefficient of semiconductor layer 210. For example, when semiconductor layer 210 is $Al_yGa_{1-y}As$ with y in a range between about 0.2 and 0.3, thickness $W_1$ is preferably less than about 1000 nm.

$$W_1 \ll L_{eS} = \sqrt{D_e \tau_{eS}} \qquad \text{Equation 1}$$

The combined thickness $W_2+W_3$ of semiconductor layers 220 and 225 in device 200 (or thickness of semiconductor layer 220 in device 200') is preferably less than a diffusion length of the non-equilibrium charge carriers in semiconductor layers 220 and 225, so that charge carriers injected into layer 220 can be trapped in a quantum well associated with semiconductor layer 220. Device 200' of FIG. 2D by elimination of semiconductor layer 225 can more easily position semiconductor layer 220 for capture of the injected charge carriers.

The thickness $W_2$ of semiconductor layer 220 is also selected to limit the spin/angular momentum of low energy holes trapped in semiconductor layer 220. The majority of semiconductors with direct optical transitions, such as those listed above, have holes that can be classified as either light holes or heavy holes. The light holes generally differ from the heavy holes in their effective mass and in their total moment. In particular, the light holes have an effective mass $m_{lh}$ and a total moment of $\pm\frac{1}{2}$, and the heavy holes have an effective mass $M_{hh}$ and a total moment of $\pm\frac{3}{2}$. The effective mass $m_{hh}$ of the heavy holes is typically much greater than the effective mass $m_{lh}$ of the light holes. Accordingly, the properties of semiconductor layers 210, 220, and 230 (and layer 225 if present) can be chosen so that low energy heavy holes can be trapped in the quantum well associated with semiconductor layer 220, while the light holes do not have a bound state associated with the quantum well.

In accordance with an aspect of the invention, the thickness $W_2$ of semiconductor layer 220 is such that the associated quantum well has quantized/bound energy levels of the heavy holes but no bound states of light holes. Generally, reducing the thickness $W_2$ of a quantum well increases the energy level of the lowest bound state more rapidly for a light particle than for a heavy particle since the bound state energy is inversely proportional to the mass of the particle. The lower energy levels of the light holes are preferably higher than the thermal energy $k_BT$, where T is the temperature and $k_B$ is the Boltzmann constant, so that the lower levels will not be populated by thermally excited holes. Thus, the thickness $W_2$ preferably satisfies the conditions given in Equations 2 and 3. In Equations 2 and 3, $L_{D2}$ is the diffusion length in the quantum well layer 220, h is the Planck constant, and $m_{lh}$ and $m_{hh}$ are respectively the masses of light and heavy holes. The heavy holes will be confined in the quantum well if the depth U of the well meets the criterion of Equation 4.

Equation 2:
$$W_2 \ll L_{D2}$$

Equation 3:
$$w_0 > W_2 \geq w_0 \sqrt{m_{lh}/m_{hh}}, \quad \text{where } w_0 = \frac{h}{\sqrt{2m_{lh}k_BT}}$$

Equation 4:
$$U > \hbar^2/(2m_{hh}W_2^2)$$

The minimum energy of the light holes (i.e., holes with projections of the effective spin $\pm\frac{1}{2}$) in the quantum well associated with semiconductor layer 220 preferably exceeds $k_BT$ by design, so that light holes cannot accumulate in layer 220. As a result, electrons in semiconductor layer 220 can only recombine with heavy holes. Further, only heavy holes having spin projection $\mu_{hh}=-\frac{3}{2}$ can combine with electrons having spin polarization $\mu_e=+\frac{1}{2}$, according to selection rule for angular momentum, in the channel $\mu_e+\mu_{hh}=-1$. Other channels, such as associated with electrons with spin projection $+\frac{1}{2}$ and heavy holes with spin projection $+\frac{3}{2}$, $\mu_e+\mu_{hh}=2$, are prohibited for a single emitted photon. Therefore, the emitted photons will nearly all have the same spin projection −1, and the emitted radiation will be right or left circularly polarized depending on the convention used to define the positive spin direction.

Highly polarized light is thus emitted due to radiative recombination of the heavy holes with accumulated spin-polarized electrons. This occurs when the spontaneous or stimulated radiation lifetime is less than the spin relaxation time of the electrons in semiconductor layer 220. This may be realized when concentration of injected electrons in semiconductor layer 220 is relatively high, for example, above about $10^{17}$ cm$^{-3}$.

Optional semiconductor layer 225 separates the quantum well associated with semiconductor layer 220 from the p-n junction. Semiconductor layer 225 preferably has a wider band gap than does layer 220 and has a thickness $W_3$ sufficient to separate the quantum well associated with semiconductor layer 220 from the effects of the charge separation and voltage that arises at a p-n junction, i.e., at the interface between semiconductor layers 225 and 230.

As noted above, semiconductors layer 210 and 230 can be relatively heavily doped respectively with n-type and p-type impurities and have energy band gaps $E_{g1}$ and $E_{g3}$ that are wider than the energy band gap $E_{g2}$ of semiconductor layer 220, i.e. $E_{g1}>E_{g2}$, $E_{g3}>E_{g2}$. One way to accomplish this is to form semiconductor layers 210, 220, and 230 as double heterostructures. Examples of double heterostructures include $Al_yGa_{1-y}As$—$GaAs$—$Al_xGa_{1-x}As$ and $In_yGa_{1-y}As$—$InGaAs$—$In_xGa_{1-x}As$, where x and y refer to the chemical composition of the relevant materials. It is typically preferred that x be about 0.125 to 0.2 (x≈0.125–0.2) and y be about 0.2 to 0.3 (y≈0.2–0.3.) The doping profiles of semiconductor layers 210, 220, and 230 can further be controlled through conventional techniques such as ion implantation or deposition of impurities, for example, to create layer 215 or 225.

Various impurities may be used to dope semiconductor layers 210, 220, and 230. Generally, different impurities are available for use as electron donors and acceptors in different semiconductor materials. For example, zinc (Zn), lead (Pb), cadmium (Cd), silver (Ag), and manganese (Mn) may be used to positively dope semiconductor layer 220 or 230 if semiconductor layer 220 or 230 is made of typical direct-gap semiconductors such as GaAs, GaAsAl, and InGaAs. Materials such as silicon (Si), germanium (Ge), selenium (Se), tellurium (Te), and tin (Sn) can negatively dope semiconductor layer 210 or 220 if semiconductor layer 210 or 220 is made of typical direct-gap semiconductors such as GaAs, GaAsAl, and InGaAs.

The δ-doped layer 215, which is very thin and very heavily doped with n-type impurities, can be formed at the interface between magnetized layer 270 and semiconductor layer 210. The δ-doped layer 215 generally improves the efficiency of transmission by tunneling of spin-polarized electrons through the interface layer between magnetized layer 270 and semiconductor layer 210 and thereby improves the level of spin polarization of electrons remaining in semiconductor layer 210.

Figure 3:
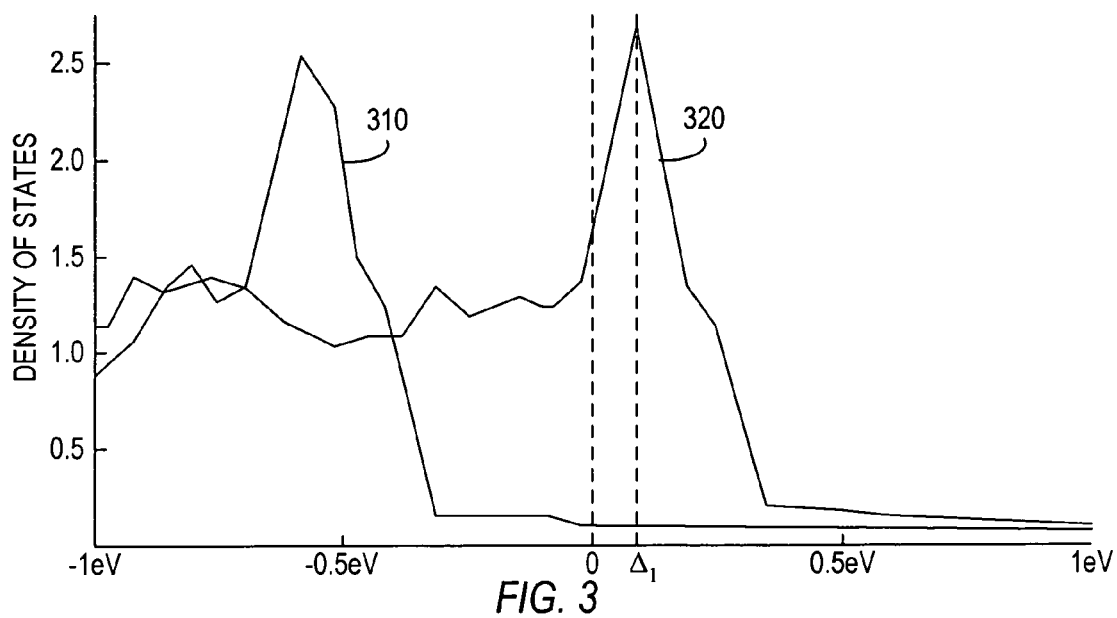
FIG. 3 shows plots of the density of states for majority and minority d-electrons in magnetized nickel.

A mechanism for this improvement in spin polarization can be seen through examination of the density of states (DOS) of electrons in a magnetized material. FIG. 3, for example, shows plots 310 and 320 of the DOS in magnetized Ni of d-electrons having spin projections respectively opposite to and along the magnetization direction. The DOS function $g_i(E)$ is generally defined such that a product $g_i(E)dE$ of DOS $g_i(E)$ for a material and an infinitesimal energy interval dE indicates the number of electron states characterized by some quantum numbers i per unit volume in an energy interval (E,E+dE). The Fermi level $E_F$ chosen to be the energy origin in FIG. 3 As shown in FIG. 3, electron states having energies below the Fermi level, which are the normally occupied electron states, include an excess of electron states having spin opposite to the magnetization direction, i.e., majority d-electrons, which create the magnetic field of the magnetized Ni. In contrast, majority d-electron states are relatively scarce at least at some energies above the Fermi level when compared to the minority d-electron states, i.e., electron states having spin projection in the direction of the magnetic field. The s- and p-electron states are similarly scarce at energies just above the Fermi level. As a result, the electron states having energies above the Fermi level include an excess of d-electrons having the minority spin state. Note that the DOS for most ferromagnetic materials have high peaks for majority and minority d-electrons that are separated by characteristic energy intervals.

A peak in the DOS of minority d-electron states as shown in FIG. 3 is at an energy $\Delta_0$, which for Ni is about 0.1 eV above the Fermi level. Other ferromagnetic metals such as Co and Fe and many ferromagnetic alloys exhibit similar peaks in the density of minority d-electrons at energies above the Fermi level. Near energy $\Delta_0$, the DOS of the majority d-electrons and DOS of s- and p-electrons are negligible when compared with the DOS of minority d-electrons. Accordingly, if the conduction electrons forming a current into or out of the magnetized material have energy $\Delta_0$, the electrons would be almost 100% spin polarized, i.e., almost 100% minority d-electrons.

The δ-doped layer 215 preferably screens the Schottky barrier at the interface between magnetized layer 270 and semiconductor layer 210 so that the barrier becomes transparent for tunneling electrons. In other words, the electrons may easily traverse δ-doped layer 215. If the conditions of Equations 5 are satisfied, the electrons may easily tunnel through δ-doped layer 215: In Equations 5, $N_d$ represent donor concentration of δ-doped layer 215; $l_+$ represent the thickness of δ-doped layers 215; $\epsilon_0$ represents the permittivity of free space; E represents a relative permittivity of semiconductor layer 210; $\Delta_1$ represents the height of the Schottky barrier (as measured from the Fermi level of magnetized layer 270) at the boundary between magnetized layer 270 and δ-doped layer 215; $A_2$ represents the height of the lower and wider potential barrier in semiconductor layer 210 (also measured from Fermi level of magnetized ferromagnetic layer 270); q represents elementary charge; $\hbar$ is the Planck's constant, and $m^*$ represents an effective mass of an electron in δ-doped layer 215. Typically, thicknesses $l_+$ is about 1–2 nm, and donor concentration $N_d$ may be greater than or about equal to $10^{19}$ to $10^{20}$ cm$^{-3}$.

Equations 5:

$$N_d \approx 2\frac{\varepsilon_0\varepsilon(\Delta_1 - \Delta_2)}{q^2 l_+^2}, \quad l_+ \le t_1 = \sqrt{\frac{\hbar^2}{2m^*(\Delta_1 - \Delta_2)}}$$

Delta doping of semiconductor layer 210 may form δ-doped layer 215. More specifically, an upper portion of n+ semiconductor layer 210 may be heavily doped with electron-rich materials. For example, if semiconductor layer 210 is formed from GaAs, materials such as Ge, Se, Te, Si, Pb, and Sn may be used as dopants. Such delta doping is typically performed by depositing/evaporating a (sub)monolayer of metal on top of a semiconductor.

The electrons that tunnel through the relatively high potential barrier $\Delta_1$ of the thin δ-doped layer 215 face another potential barrier formed by the band gap in semiconductor layer 210. This barrier has a height $\Delta_2$ that in general can be selected during device fabrication, for example, through control of the donor concentration of n+ semiconductor layer 210. The barrier height $\Delta_2$ of semiconductor layer 210 is preferably about equal to the energy $\Delta_0$ for which the DOS of minority d-electrons in magnetized layer 270 has a peak. Further, semiconductor layer 210 is sufficiently wide to prevent tunneling of electrons having energies much less than about energy $\Delta_0$. Preferably, as noted above, thickness $W_1$ is also thinner than the diffusion length $L_{D1}$ of the charge carriers of semiconductor layer 210. When this occurs, electrons with energies below the barrier height $\Delta_2$ are effectively blocked or filtered away and, essentially, only the electrons with energies E above the barrier height $\Delta_2$ are able to traverse the length of semiconductor layer 210 between magnetized layer 270 and quantum well layer 222. The current through the interface with magnetized layer 270 will thus be composed of almost all minority d-electrons. In other words, the extracted or injected current through magnetized layer 270 will be almost 100% spin-polarized.

A spin extraction mode of operation of device 200 or 200' of FIG. 2A or 2D can now be explained with reference to FIGS. 2B and 2C or FIGS. 2E and 2F. Under positive control voltage $V_F$, spin-polarized electrons are efficiently extracted from semiconductor layer 210 through δ-doped layer 215 into magnetized layer 270, leaving semiconductor layer 210 with spin-polarized electrons having spin projection in a direction opposite to that of the extracted spin-polarized electrons. As a convention, the remaining conduction electrons in semiconductor layer 210 can be referred to as being predominantly "spin down" or having a spin projection −½ relative to the magnetization direction of magnetized layer 270. When the thickness $W_1$ of semiconductor layer 210 is much less than diffusion length $L_{D1}$ of non-equilibrium carriers in semiconductor layer 210, the spin-down electrons traverse semiconductor layer 210 and accumulate in the quantum well associated with the narrower band gap of semiconductor layer 220. Simultaneously, holes from p+ semiconductor layer 230 enter into semiconductor layer 220, where the heavy holes with total moment ³⁄₂ accumulate, blocked by the energy barrier $\Delta_3$, provided that $\Delta_3 >> k_B T$. The spin down electrons having spin projection −½ combine with heavy holes having spin/angular momentum projection +³⁄₂, producing photons with spin projection +1.

A spin injection mode of operation of device 200 or 200' can similarly be explained. Under a negative control voltage $V_F$, almost 100% "spin up" electrons are efficiently injected from magnetized layer 270 through δ-doped layer 215 into n-doped semiconductor layer 210. When the thickness $W_1$ of semiconductor layer 210 is much less than diffusion length $L_{D1}$ of non-equilibrium carriers in semiconductor layer 210, the spin up electrons traverse semiconductor layer 210 and accumulate in quantum well created by the narrower band gap $E_{g2}$ of semiconductor layer 220. Simultaneously, holes from p+ semiconductor layer 230 enter into semiconductor layer 220 through layer 225. The spin up electrons having spin projection +½ combine with heavy holes having spin/angular momentum projection −³⁄₂, creating photons with spin projection −1. Accordingly, the spin injection mode of device 200 produces polarized light with circular polarization orthogonal to the circular polarization of light emitted in the extraction mode.

The spin extraction mode of device 200 has some advantages over the spin injection mode. In particular, the interface between magnetized layer 270 and n+ semiconductor layer 210 is effectively forward biased in the extraction mode and can provide a much higher current of spin-polarized electrons than is possible in the injection mode. Further, higher doping concentration in δ-doped layer 215 can be used in an extraction mode device to further reduce the thickness of the tunnel barrier and increase the tunnel current. It may additionally be shown that the nearly full polarization of the carriers remaining in semiconductor layer 210 and, consequently, in semiconductor layer 220 can be achieved at smaller currents than possible with a spin injection mode of operation.

One fabrication process for device 200 or 200' sequentially grows layers 210, 220, and 230 on substrate 240 with in-situ doping or with periodic ion implantation or other doping steps as necessary to achieve the desired doping profile. In particular, δ-doped layer 215 can be formed in n⁺ semiconductor layer 210, for example, by deposition of one or more monolayers of the desired n-type impurity. Clad semiconductor layer 225 can similarly be formed by varying the dopant concentration relative to semiconductor layer 220. Magnetized layer 270 is formed overlying δ-doped layer 215 using conventional techniques such as CVD deposition, sputtering, or other known techniques.

An exemplary embodiment of device 200' formed by the above process may be described as having an M-δ-n-QW-p structure corresponding to layers 270, 215, 210, 220, and 230, respectively. An example of such structure is Ni-(δ-Ga$_{0.875}$Al$_{0.125}$As)-(n$_1$-Ga$_{0.875}$Al$_{0.125}$As)-(n$_2$-GaAs)-(p$_3$-Ga$_{0.8}$Al$_{0.2}$As). In this example, magnetized layer 270 is Ni; semiconductor layer 210 and δ-doped layer 215 are Ga$_{1-x}$Al$_x$As with composition Parameter x being 0.125 and respective dopings n$_1$ and δ; semiconductor layer 220 is GaAs with n$_2$ doping; and semiconductor layer 230 are Ga$_{1-y}$Al$_y$As with composition parameter y being 0.2 and p$_3$ doping. Table 1 lists a few other examples of suitable material combinations.

TABLE 1

Example Material Combinations

| Example | FM Layer | δ Layer | n+ Layer | QW Layer | p+ Layer |
|---|---|---|---|---|---|
| 1 | Ni(Co,Fe) | $Ga_{1-x}Al_xAs$ | $Ga_{1-x}Al_xAs$ | GaAs | $Ga_{1-y}Al_yAs$ |
| 2 | Ni(Co,Fe) | GaAs | GaAs | $In_xGa_{1-x}As$ | GaAs |
| 3 | Ni(Co,Fe) | $Pb_xSn_{1-x}Te$ (with Si or Ge doping) | $Pb_xSn_{1-x}Te$ | $Pb_ySn_{1-y}Te$ | $Pb_xSn_{1-x}Te$ |
| 4 | Ni(Co,Fe) | $Zn_xCd_{1-x}Se$ | ZnSe | ZnSe | $Zn_yCd_{1-y}Se$ |

An alternative fabrication process for device 200' grows δ-doped layer 215 as an n+-doped epitaxial layer on semiconductor layer 210. The epitaxially grown δ-doped layer 215 is preferably doped as heavily as practicable and as thin as practicable. Additionally, an epitaxially-grown δ-doped layer 215 preferably has a donor concentration $N_d$ and a thickness $l_+$ satisfying the conditions of Equations 5. Table 2 gives some examples of materials for the M-δ-n-QW-p structure of device 200 as described above but with δ-doped layer 215 formed by epitaxial growth.

TABLE 2

Example Material Combinations

| Example | FM Layer | δ Layer | n+ Layer | QW Layer | p+ Layer |
|---|---|---|---|---|---|
| 1 | Ni(Co,Fe) | GaAs | $Ga_{1-x}Al_xAs$ | GaAs | $Ga_{1-y}Al_yAs$ |
| 2 | Ni(Co,Fe) | $In_{1-x}Ga_xAs$ | GaAs | GaAs | GaAs |
| 3 | Ni(Co,Fe) | $Cd_xHg_{1-x}Te$ | CdTe | CdTe | $Cd_yHg_{1-y}Te$ |
| 4 | Ni(Co,Fe) | $Zn_xCd_{1-x}Se$ | ZnSe | ZnSe | $Zn_yCd_{1-y}Se$ |

Electrical contacts to device 200 or 200' can be formed using conventional techniques. In particular, magnetized layer 270 may itself be used as a contact for application of control voltage $V_F$ or alternatively an electrical contact structure to magnetized layer 270 can be formed in an opening through any overlying layers such as overlying circuit or passivation layers (not shown). An electrical contact structure to n+ layer 210 can be similarly formed by etching an opening through magnetized layer 270 (and optionally through δ-doped layer 215), forming insulating sidewall spacers in the opening, and depositing a plug metal or other conductive material in the remaining portion of the opening. A bottom contact can be used for electrical connection to p+ semiconductor layer 230 when substrate 240 contains a conductive material or via. Alternatively, when substrate is made of an insulator such as sapphire, a fabrication process for a top electrical contact to p+ semiconductor layer 230 can include: etching an opening through magnetized layer 270, δ-doped layer 215, semiconductor layer 210, and semiconductor layer 220; forming insulating sidewall spacers in the opening, and depositing a plug metal or other conductive material in the remaining portion of the opening. After device fabrication in a wafer, the wafer can be cut and the cut edge polished for emission of light from the edge of semiconductor layer 220.

Figure 4A:
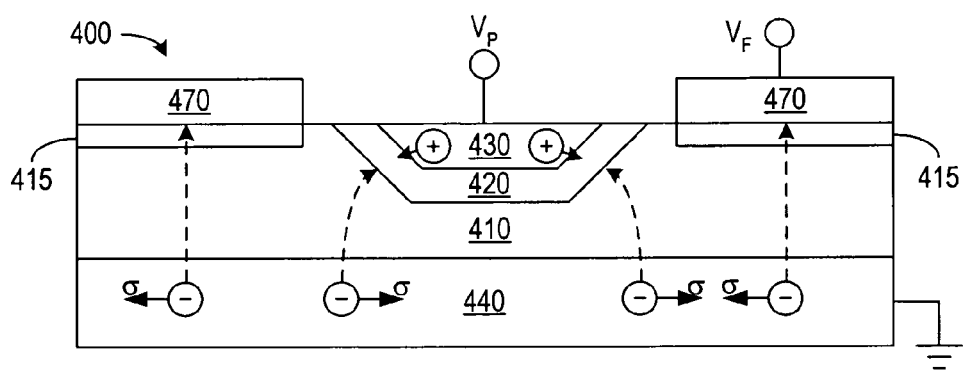
FIGS. 4A and 4B respectively show a cross-section and a perspective view of a light-emitting device in accordance with an embodiment of the invention that emits radiation from a major surface of the device.
Figure 4B:
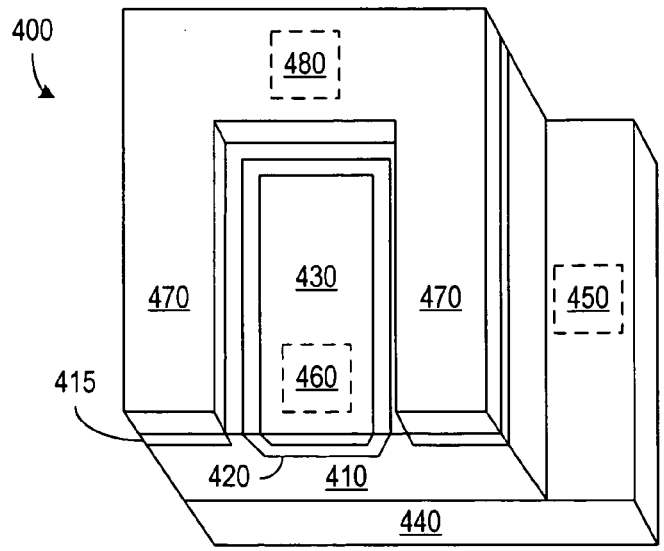

FIGS. 4A and 4B respectively show a cross-section and a perspective view of a surface-emitting device 400 in accordance with an embodiment of the invention. Device 400 includes an epitaxial semiconductor layer 410 on a conductive substrate 440. A quantum well region 420, a p+ region 430, and a δ-doped region 415 are formed in semiconductor layer 410, and a magnetized layer 470 is formed on δ-doped region 415. In an exemplary embodiment of the invention, substrate 440 is a semiconductor substrate that is heavily doped with n-type or donor impurities. Epitaxial layer 410 is also a heavily doped n-type semiconductor, and quantum well region 420 is a p-type semiconductor. The p-n junction formed near region 420 in layer 410 is preferably a shallow junction, so that photons created by recombination of electrons and holes in quantum well region 420 can be emitted through an opening in magnetized layer 470.

The materials and properties of n+ semiconductor layer 410, δ-doped region 415, quantum well region 420, p+ region 430, and magnetized layer 470 in general can be substantially the same as described above for n+ layer 210, δ-doped layer 215, quantum well layer 220, p+ layer 230, and magnetized layer 270, respectively. In particular, quantum well region 420 preferably has a band gap that is narrower than the band gaps of semiconductor layer 410 and semiconductor region 430 so as to form a quantum well that traps electrons and holes for recombination. Further, the thickness of region 420 is such that only heavy holes having total moment ½ can be trapped in region 420. The δ-doped region 415 shapes the potential barrier at the interface of magnetized layer 470 and semiconductor layer 410 to create a thin barrier that is nearly transparent to tunneling electrons. The band gap of semiconductor layer 410 is such that the difference between the Fermi level in magnetized layer 470 and the lowest conduction band states in semiconductor layer 410 is about equal to an energy $\Delta_0$ at which magnetized layer has a peak in the DOS for minority d-electrons. Further, semiconductor layer 410 is thick enough to block tunneling of conduction electrons having energies below energy $\Delta_0$, so that electrons flowing between semiconductor layer 410 and magnetized layer 470 are highly spin-polarized.

In one exemplary embodiment of the invention, n+ semiconductor layer 410 is a layer of GaAs about 200 nm thick and having a doping concentration of about $10^{17}$ cm$^{-3}$ of an n-type impurity such as Se, Sn, Si, or Ge. The δ-doped region 415 is preferably less than about 1 to 2 nm thick and has a doping concentration of about $10^{20}$ cm$^{-3}$ of an n-type impurity such as Se, Sn, Si, or Ge. Quantum well region 420 has a net thickness of about 50 nm and a net doping concentration of about $10^{17}$ cm$^{-3}$ of a p-type impurity such as Zn, Mn, or Cd. The p+ region 430 has a depth/thickness that is preferably less than about 200–300 nm and has a net doping concentration of about $10^{17}$ cm$^{-3}$ of a p-type impurity such as Zn, Mn, or Cd. Magnetized layer 470 is a layer of Ni having a thickness of about 100 nm and a magnetization of about 1 $\mu_B$ per atom, where $\mu_B$ is the Bohr magneton. These specific values and materials given here are intended to provide an example construction of device 400, but more generally, n+ semiconductor layer 410, δ-doped region 415, quantum well region 420, p+ region 430, and magnetized layer 470 are subject to a wide variety of variations and substitutions such as described above in regard to corresponding structures of device 200 of FIG. 2A.

One fabrication process for device 400 begins with epitaxial growth of n+ semiconductor layer 410 on substrate 440. Masked doping processes can then form regions 415, 420, and 430. For example, delta-doping or further epitaxial or molecular growth using a mask to protect areas including region 420 can then form δ-doped region 415. Magnetized layer 470 can then be deposited on δ-doped region 415 and patterned to provide an opening through which subsequent doping processes can form regions 420 and 430 in semiconductor layer 410. Electrical contact structures can then be fabricated using conventional techniques.

FIG. 4B shows contact areas 450, 460, and 480 that permit application of independent voltages to n+ semiconductor layer 410 (via substrate 440), p+ region 430, and magnetized layer 470. Voltages $V_P$, $V_F$, and ground can be applied to n+ semiconductor layer 410, p+ semiconductor region 430, and magnetized layer 470 to operate device 400 in a spin extraction mode or a spin injection mode that emits polarized radiation from the major surface device 400.

Figure 4C:
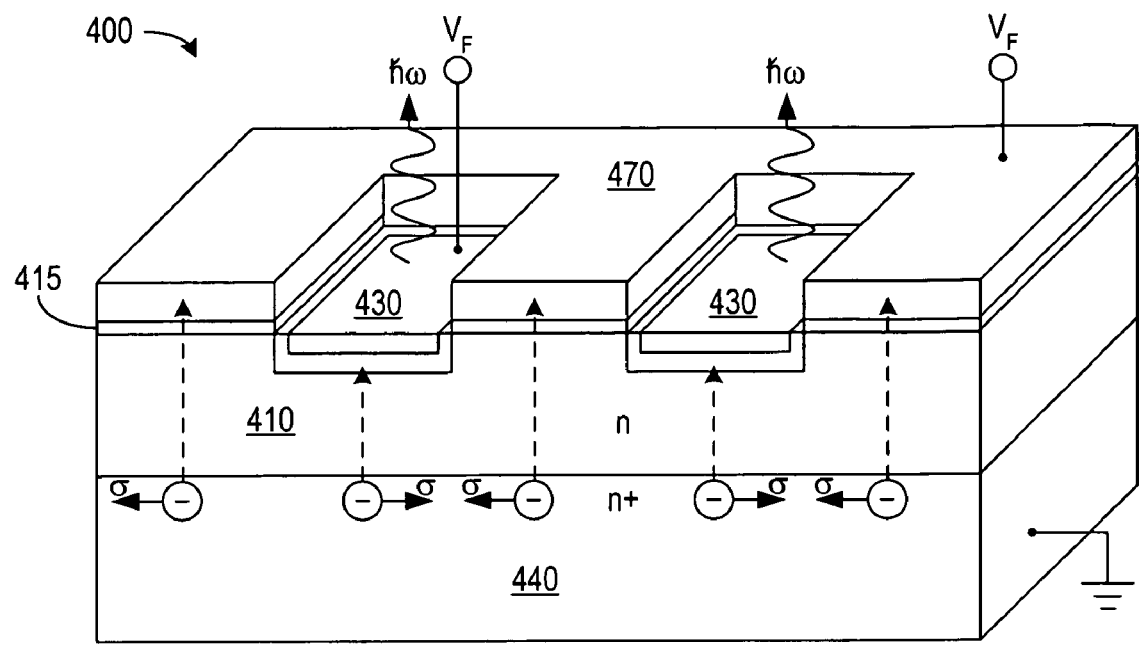
FIG. 4C shows a perspective view of an embodiment of the invention in which a light-emitting device emits polarized radiation from multiple openings in a magnetized layer.

FIG. 4C illustrates an embodiment of the invention in which device 400 emits radiation through multiple openings in the magnetized layer 470. In such an embodiment, the size of the openings can be maximized to increase the surface area for radiation emission since a small area of ferromagnetic layer 470 can provide a high current of spin-polarized electrons.

Figure 5:
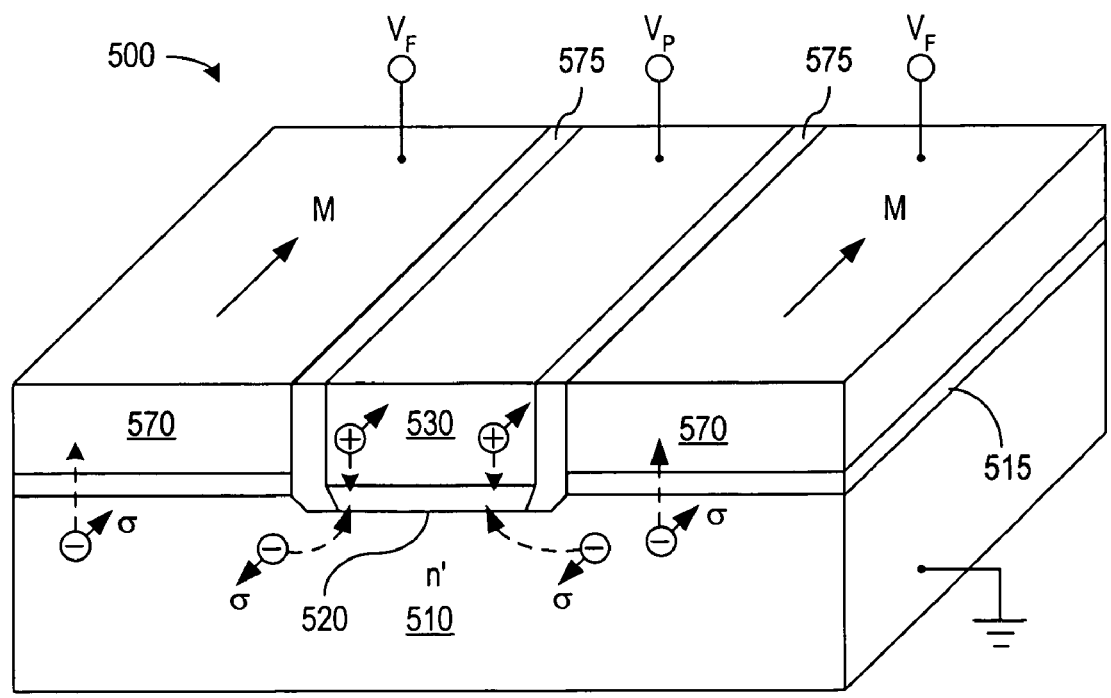
FIG. 5 shows a perspective view of a light-emitting device according to an embodiment of the present invention including semiconductor layers that reside in an opening that passes through a magnetized ferromagnetic material.

FIG. 5 illustrates a light-emitting device 500 in accordance with yet another embodiment of the invention. Device 500 includes an n+ semiconductor layer 510 which can be grown on an underlying substrate (not shown). A δ-doped layer 515 and a magnetized ferromagnetic layer 570 are formed on n+ semiconductor layer 510 and patterned to include one or more openings in which insulating sidewall spacers 575 and semiconductor layers 520 and 530 are formed. The n+ semiconductor layer 510, δ-doped layer 515, and magnetized ferromagnetic layer 570 are constructed using the techniques described above to create an interface that acts as a spin filter for electrons flowing between semiconductor layer 510 and magnetized layer 570. Accordingly, spin polarized electrons can be extracted from (or injected into) semiconductor layer 510 when a control voltage $V_F$ is applied.

Semiconductor layer 520 is formed on semiconductor layer 510, and p+ semiconductor layer 530 is formed on semiconductor layer 510. Sidewall spacers 575 insulate semiconductor layers 520 and 530 from magnetized layer 570 and δ-doped layer 515, so that current through semiconductor layer 520 primarily corresponds to holes flowing from p+ layer 530 and spin-polarized electrons from n+ semiconductor layer 510 when a bias voltage $V_P$ is applied to p+ semiconductor layer 530. Using the techniques and characteristics described above, semiconductor layer 520 creates a quantum well that traps spin-polarized electrons from n+ semiconductor layer 510 and heavy holes from p+ semiconductor layer 530 for recombination and generation of polarized radiation.

A fabrication process for device 500 includes growing n+ semiconductor layer 510 on a substrate (not shown); doping semiconductor layer 510 to form δ-doped layer 515 or alternatively depositing δ-doped layer 515 (e.g., by epitaxial or molecular growth) on semiconductor layer 510; and depositing magnetized ferromagnetic layer 570 on δ-doped layer 515. A patterned etch process then forms one or more openings in magnetized layer 570 and δ-doped layer 515, and insulating sidewall spacers 575 are formed on walls of the openings. Such sidewall spacers 575 can be formed in a conventional manner by depositing a conformal layer of an insulator such as silicon dioxide on magnetized layer 570 and in the opening. A directional or anisotropic etch can then remove the insulating layer from the major surfaces but leave spacers 575 on the sidewalls of the opening. Semiconductor layer 520 can then be deposited or grown in the opening and on semiconductor layer 510 and can be doped as required to create the desired quantum well. Semiconductor layer 530 is deposited or grown on semiconductor layer 520 and doped as required. Electrical contact structures to n+ semiconductor layer 510, p+ semiconductor layer 530, and magnetized ferromagnetic layer 570 can be formed using conventional techniques such as a bottom contact for semiconductor layer 510 and top surface contacts for layers 530 and 570.

Although the invention has been described with reference to particular embodiments, the description is only an example of the invention's application and should not be taken as a limitation. For example, although the above description sometimes refers to light or light-emitting devices such terms are intended in their broader sense to include electromagnetic radiation whether or not the wavelength of the radiation is in the visible spectrum. Further, although some exemplary devices described perform as light-emitting diodes that produce polarized light, other embodiments of the invention that operate as semiconductor lasers can be constructed using the principles described above in combination with well known techniques for forming the reflectors and resonant cavities required in semiconductor lasers. Various other adaptations and combinations of features of the embodiments disclosed are within the scope of the invention as defined by the following claims.

What is claimed is:

1. A light-emitting device comprising:
   a diode including a first semiconductor region having an n-type doping, a second semiconductor region having a p-type doping, and a quantum well that accumulates heavy holes for recombination and does not accumulate light holes; and
   a spin filter having an interface with one of the first and second semiconductor regions, wherein operation of the spin filter extracts spin-polarized electrons from the diode, leaving at least partially spin-polarized charge carries in the diode.

2. The device of claim 1, wherein the quantum well is within a p-n junction in the diode.

3. The device of claim 1, wherein a control signal applied to the spin filter can alter a density of spin-polarized charge carriers in the diode and thereby modulate a level of polarization of radiation emitted from the diode.

4. The device of claim 1, wherein the spin filter comprises a magnetized ferromagnetic material that forms the interface with one of the first and second semiconductor regions.

5. A light-emitting device comprising:
   a diode including a first semiconductor region having an n-type doping and a second semiconductor region having a p-type doping; and
   a spin filter having an interface with one of the first and second semiconductor regions, wherein operation of the spin filter extracts spin-polarized electrons from the diode, leaving at least partially spin-polarized charge carries in the diode, and wherein the spin filter comprises a magnetized ferromagnetic material that forms the interface with one of the first and second semiconductor regions and a δ-doped layer adjacent the magnetized ferromagnetic material.

6. A light-emitting device comprising:
a diode including a first semiconductor region having an n-type doping and a second semiconductor region having a p-type doping; and
a spin filter having an interface with the first semiconductor region, wherein operation of the spin filter extracts spin-polarized electrons from the diode, leaving at least partially spin-polarized charge carries in the diode, and wherein the spin filter comprises a Schottky contact between a ferromagnetic layer and the first semiconductor layer modified with a δ-doped layer and operated at a forward bias.

7. A light-emitting device comprising:
a first semiconductor region having an n-type doping;
a second semiconductor region formed adjacent to the first semiconductor region;
a third semiconductor region adjacent to the second semiconductor region, the third semiconductor region having a p-type doping;
a magnetized layer forming an interface with the first semiconductor region; and
first, second, and third electrical contact structures that permit application of independent electrical signals respectively to the first semiconductor region, the magnetized layer, and the third semiconductor region.

8. The device of claim 1, further comprising a δ-doped layer between the magnetized region and the first semiconductor region.

9. The device of claim 1, wherein the device emits radiation having an intensity that depends on a voltage difference between the first and third electrical contact structures.

10. The device of claim 9, wherein the radiation emitted from the device has a polarization level that depends on a voltage difference between the first and the second electrical contact structures.

11. The device of claim 1, wherein a voltage difference between the first and the second electrical contact structures causes extraction of spin-polarized electrons from the first semiconductor region.

12. The device of claim 1, wherein the first semiconductor region has a first band gap, the second semiconductor region has a second band gap that is narrower than the first band gap, the third semiconductor region has a third band gap that is wider than the second band gap.

13. The device of claim 1, wherein the second semiconductor region creates a quantum well in which heavy holes accumulate and light holes do not accumulate.

14. The device of claim 1, wherein the second semiconductor region creates a quantum well within the p-n junction formed by the first and second semiconductor regions.

15. The device of claim 1, wherein:
the first semiconductor region comprises a first layer overlying a substrate;
the second semiconductor region comprises a second layer overlying the first layer; and
the third semiconductor region comprises a third layer overlying the second layer.

16. The device of claim 15, wherein the device emits light through an edge of the second semiconductor layer.

17. The device of claim 1, wherein:
the first semiconductor region comprises a first portion of a semiconductor layer;
the third semiconductor region comprises a doped region of the semiconductor layer; and
the second semiconductor region comprises a doped region residing in the semiconductor layer between the first region and the second region.

18. The device of claim 17, wherein the magnetized region overlies the semiconductor layer and includes an opening overlying the second region, and wherein the device emits light through the opening.

19. The device of claim 7, wherein:
the first semiconductor region comprises at least a portion of a first semiconductor layer;
the magnetized layer overlies the first semiconductor layer and includes an opening;
the second semiconductor region comprises a second semiconductor layer, the second semiconductor layer residing in the opening; and
the third semiconductor region comprises a third semiconductor layer overlying the second semiconductor layer.

20. The device of claim 19, further comprising sidewall spacers that are in the opening and insulate the second region from direct electrical contact with the magnetized layer.

21. A method for producing polarized radiation, comprising:
maintaining a first semiconductor region of a diode at a reference voltage;
applying a bias voltage to a second semiconductor region of the diode to drive a current through the diode and cause emission of radiation; and
applying a control voltage to a magnetized region that forms an interface with one of the first and second semiconductor regions, wherein the control voltage drives a current of spin polarized electrons through the interface.

22. The method of claim 21, wherein applying the control voltage extracts spin polarized electrons from the diode.

23. The method of claim 21, further comprising:
maintaining the bias voltage at a level that provides a constant intensity of emitted light; and
varying the control voltage to alter a percentage polarization of the emitted light.

* * * * *

UNITED STATES PATENT AND TRADEMARK OFFICE
CERTIFICATE OF CORRECTION

PATENT NO.        : 7,208,775 B2                                    Page 1 of 1
APPLICATION NO.   : 11/061060
DATED             : April 24, 2007
INVENTOR(S)       : Viatcheslav V. Osipov et al.

It is certified that error appears in the above-identified patent and that said Letters Patent is hereby corrected as shown below:

In column 7, line 5, delete "$\mu_c$" and insert -- $\mu_e$ --, therefor.

In column 15, line 28, in Claim 8, delete "claim 1" and insert -- claim 7 --, therefor.

In column 15, line 31, in Claim 9, delete "claim 1" and insert -- claim 7 --, therefor.

In column 15, line 39, in Claim 11, delete "claim 1" and insert -- claim 7 --, therefor.

In column 15, line 43, in Claim 12, delete "claim 1" and insert -- claim 7 --, therefor.

In column 15, line 48, in Claim 13, delete "claim 1" and insert -- claim 7 --, therefor.

In column 15, line 51, in Claim 14, delete "claim 1" and insert -- claim 7 --, therefor.

In column 15, line 54, in Claim 15, delete "claim 1" and insert -- claim 7 --, therefor.

In column 16, line 7, in Claim 17, delete "claim 1" and insert -- claim 7 --, therefor.

Signed and Sealed this

Twenty-seventh Day of October, 2009

David J. Kappos
*Director of the United States Patent and Trademark Office*